United States Patent
Lewis

(12) 
(10) Patent No.: US 6,251,334 B1
(45) Date of Patent: Jun. 26, 2001

(54) COMPOSITE CONSTRUCTIONS HAVING MIXED ORGANIC/INORGANIC LAYERS

(75) Inventor: Thomas E. Lewis, East Hampstead, NH (US)

(73) Assignee: Presstek, Inc., Hudson, NH (US)

( * ) Notice: Subject to any disclaimer, the term of this patent is extended or adjusted under 35 U.S.C. 154(b) by 0 days.

(21) Appl. No.: 09/271,307

(22) Filed: Mar. 17, 1999

Related U.S. Application Data

(60) Provisional application No. 60/079,013, filed on Mar. 23, 1998, now abandoned.

(51) Int. Cl.[7] ............................................. B27N 1/00
(52) U.S. Cl. .................. 264/517; 264/907; 264/909; 427/294; 427/436; 427/124
(58) Field of Search .................. 427/294, 428, 427/126.3, 124, 35, 436; 428/461, 462, 515, 519, 521, 463; 264/517, 518, 907, 909

(56) References Cited

U.S. PATENT DOCUMENTS

| | | | |
|---|---|---|---|
| 4,482,622 | * | 11/1984 | Soden et al. . |
| 4,490,774 | | 12/1984 | Olson et al. ........................ 361/311 |
| 4,647,818 | | 3/1987 | Ham ................................ 315/111.21 |
| 4,696,719 | | 9/1987 | Bischoff ............................. 202/205 |
| 4,842,893 | * | 6/1989 | Yializis et al. . |
| 4,883,731 | | 11/1989 | Tam et al. ............................. 430/41 |
| 4,954,371 | * | 9/1990 | Yializis . |
| 5,032,461 | * | 7/1991 | Shaw et al. . |
| 5,102,756 | | 4/1992 | Vincett et al ......................... 430/41 |
| 5,260,095 | | 11/1993 | Affinito ................................ 427/124 |
| 5,395,644 | * | 3/1995 | Affinito . |
| 5,440,446 | | 8/1995 | Shaw et al. ........................ 361/301.5 |
| 5,547,508 | * | 8/1996 | Affinito . |
| 5,681,615 | | 10/1997 | Affinito et al. .................... 427/255.6 |

FOREIGN PATENT DOCUMENTS

| | | |
|---|---|---|
| 0490051A1 | 6/1992 | (EP) . |
| 0664211A2 | 7/1995 | (EP) . |
| 0787583A2 | 8/1997 | (EP) . |

OTHER PUBLICATIONS

Affinito et al., "Polymer/Polymer, Polymer/Oxide, and Polymer/Metal Vacuum Deposited Interference Filters," Tenth Int'l Vacuum Web Coating Conf. (1996).

Affinito et al., "Vacuum Deposition of Polymer Electrolytes on Flexible Substrates,"Ninth Int'l Vacuum Web Coating Conf. (1995).

Affinito et al., "Polymer–Oxide Transparent Barrier Layers," SVC 39th Ann. Tech. Conf. (1996).

Affinito et al., "Comparison of Surface Treatments of PET and PLM," SVC 40th Ann. Tech. Conf. (1997).

Affinito et al., "PML/Oxide/PML Barrier Layer Performance Differences Arising from Use of UV or Electron Beam Polymerization of the PML Layers," ICMCTF97 Conf. (1997).

* cited by examiner

*Primary Examiner*—Merrick Dixon
(74) *Attorney, Agent, or Firm*—Testa, Hurwitz & Thibeault, LLP

(57) ABSTRACT

The effects of interfacial transition between organic and inorganic layers of a multilayer construction are ameliorated by incorporating an inorganic component within the matrix of the organic layer. In a first aspect, a construction having adjacent organic and inorganic layers is fabricated by depositing a curable polymer, softening the polymer, and integrating an inorganic material therewith. The polymer is then cured to immobilize the integrated deposition material, and the desired inorganic layer is applied over the deposited inorganic material (and any exposed portions of the polymer). In a second aspect, a graded structure is built up on a substrate in successive deposition steps. Both polymer precursors and an inorganic filler material are deposited in stages, with each stage containing a desired ratio of polymer to filler.

27 Claims, 1 Drawing Sheet

COMPOSITE CONSTRUCTIONS HAVING MIXED ORGANIC/INORGANIC LAYERS

RELATED APPLICATION

This application stems from U.S. Provisional Application Ser. No. 60/079,013, filed Mar. 23, 1998, abandoned.

BACKGROUND OF THE INVENTION

1. Field of the Invention

The present invention relates to composite structures in which an inorganic layer is joined to an organic layer.

2. Description of the Related Art

The fabrication of multilayer materials can pose manufacturing challenges, and the resulting constructions may exhibit performance limitations, where different types materials are joined at an interface. This is particularly so in the case of constructions having an inorganic material, such as a metal or metal compound, joined to an organic (e.g., polymeric) material. The abrupt transition between layers having very different physical properties, such as stiffness and rates of heat transport, and chemical compositions can compromise their anchorage to one another—a critical performance requirement in many applications—as well as the durability of the inorganic layer. For example, because inorganic and organic materials typically have very different coefficients of thermal expansion and elastic moduli, even perfectly adhered inorganic layers may undergo failure (e.g., fracturing) due to temperature variations or stress during manipulation and ultimate use. The different responses of two adjacent layers to an external condition can easily cause damage that would not occur in either layer by itself.

To improve interlayer anchorage, polymeric layers may be selected (or applied as intermediate coatings) based on chemical compatibility with inorganic material. A polymeric layer may also be pretreated (e.g., through plasma exposure) to modify the surface for greater interfacial compatibility with a subsequently applied inorganic layer. These approaches, however, have limited utility in addressing the effects of transition between fundamentally different materials.

DESCRIPTION OF THE INVENTION

Brief Summary of the Invention

The present invention reduces the abruptness of interfacial transition by altering the effective properties of the organic layer (to which the inorganic layer is applied) by incorporating an inorganic component within the matrix of the organic layer. Accordingly, in a first aspect, the invention comprises a method of fabricating a multilayer construction having adjacent organic and inorganic layers. A first layer comprising a curable polymer is softened, and an inorganic material—compatible with or compositionally identical to—the soon-to-be-applied inorganic layer is deposited onto a surface of the softened polymer. The inorganic material overspreads the surface and integrates within the soft polymeric layer; at this point, it may be desirable to assist the migration of the inorganic material into the polymer (e.g., by charging the inorganic material and applying an opposite charge to a conductor underlying the polymer). The polymer is then cured to immobilize the integrated deposition material, thereby forming a composite, and the desired inorganic layer is applied over the deposited inorganic material (and any exposed portions of the polymer). Depending on the application, the deposition material may fully cover the surface of the polymeric material, forming a continuous layer thereover, or may instead form an intermittent pattern over the surface.

The polymer is generally chosen both for its suitability to a desired application and for its ability to be cured into a rigid, three-dimensional structure that permanently immobilizes the inorganic deposition material. That material and its degree of loading into the polymer may be chosen to confer desired physical and/or chemical characteristics to the composite material; that is, while the composite layer may exhibit "inorganic" characteristics essential to interlayer compatibility, it may nonetheless retain various "organic" characteristics important to a particular application. For example, while the inorganic phase may have a pronounced effect on the stiffness and heat-transport properties of the composite, thereby enhancing physical compatibility with a pure inorganic layer, it may not significantly affect surface energy (so that the composite retains the the affinity for ink and/or an ink-abhesive fluid that characterized the original polymer).

The resulting multilayer material is ordinarily permanent, resisting degradation due to handling or environmental conditions. Accordingly, not suitable for the present invention are polymeric materials that exhibit a low glass-transition temperature (which permits repeated, temperature-dependent transitions between soft and rigid states) unless provided with crosslinking groups that facilitate permanent cure (and thereby defeat further phase transitions). In a preferred embodiment, the polymer comprises an acrylic polymer combined with a multifunctional acrylate monomer, which are crosslinked following deposition of the inorganic material. Acrylates, like many inorganic deposition materials, can be deposited under vacuum, permitting the entire fabrication process to be carried out in a single operation.

The multilayer constructions obtainable in accordance with the present invention are suitable to a wide variety of uses ranging from packaging to decorative materials to optical and electronic devices—essentially wherever organic and inorganic layers must be joined. For example, optically variable devices (such as the thin-film devices described in U.S. Pat. No. 4,705,356) may utilize a stack of thin layers to provide a desired optical effect (e.g., behavior as an interference filter). These layers may comprise, for example, a bottommost metal reflective layer, above which are disposed various dielectric and other metal layers. In accordance with the invention, the bottommost layer is joined to a composite substrate so the optical structure remains firmly bonded thereto, resisting delamination that could occur as a result of poor or vulnerable adhesion. Optical devices of this type may serve as labels, artwork, color-shift materials, and information-bearing structures.

Similarly, the invention may be employed in connection with optical filters having desired radiation-transmission properties (e.g., solar-control films for windows that reflect ultraviolet (UV) radiation); optical-storage structures that include an inorganic storage layer; large-array solar collectors; and electrochromic materials. In addition, the invention may be used in conjunction with electrical components such as thin-film resistors and capacitors.

Beyond compatibility, the deposition material may also confer a desired physical property to the organic layer. For example, the deposition material may be magnetic (e.g., a rare-earth magnetic material). Indeed, in this case, the material may not even be brought into contact with an overlying inorganic layer; instead the substrate may be turned over and the magnetic material used to anchor the substrate to an appropriate surface by magnetic hold-down.

In a second aspect, a graded structure is built up on a substrate in successive deposition steps. Both polymer precursors and an inorganic filler material are deposited in stages, with each stage containing a desired ratio of polymer to filler. In a preferred embodiment, the proportion of filler increases in each stage, resulting in a concentration gradient with the amount of filler increasing away from the substrate. The polymer precursors may be cured after each stage of deposition, permanently immobilizing the distribution of organic and inorganic material. An inorganic top layer is applied over a surface of the structure. The top layer, but not the underlying graded structure, may be subject to ablative removal by exposure to laser radiation.

The polymer precursor and the filler material may be deposited as a vapor or as a liquid. In one embodiment, the precursor is an acrylic polymer combined with a multifunctional acrylate monomer, the curing step crosslinking the monomers with the polymer.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1:
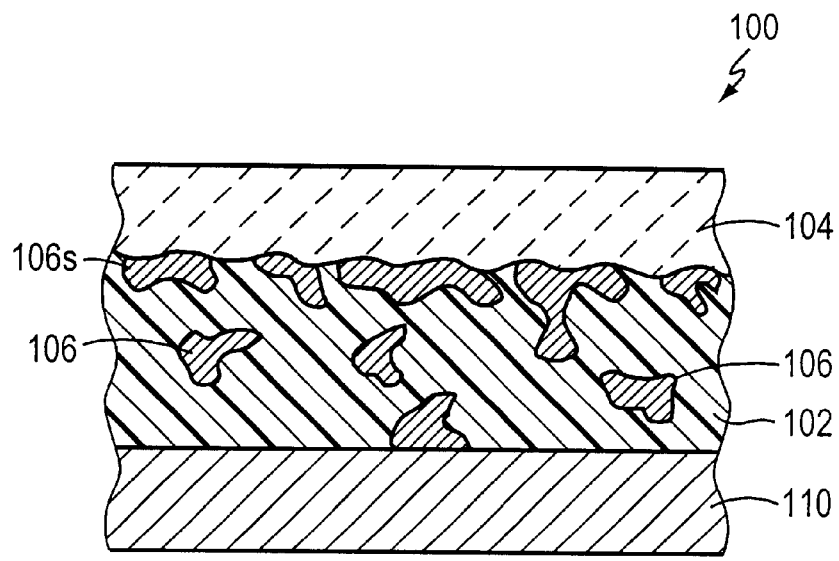
FIG. 1 is an enlarged sectional view of a multilayer construction having a mixed organic/inorganic substrate, an inorganic layer thereover.
Figure 2:
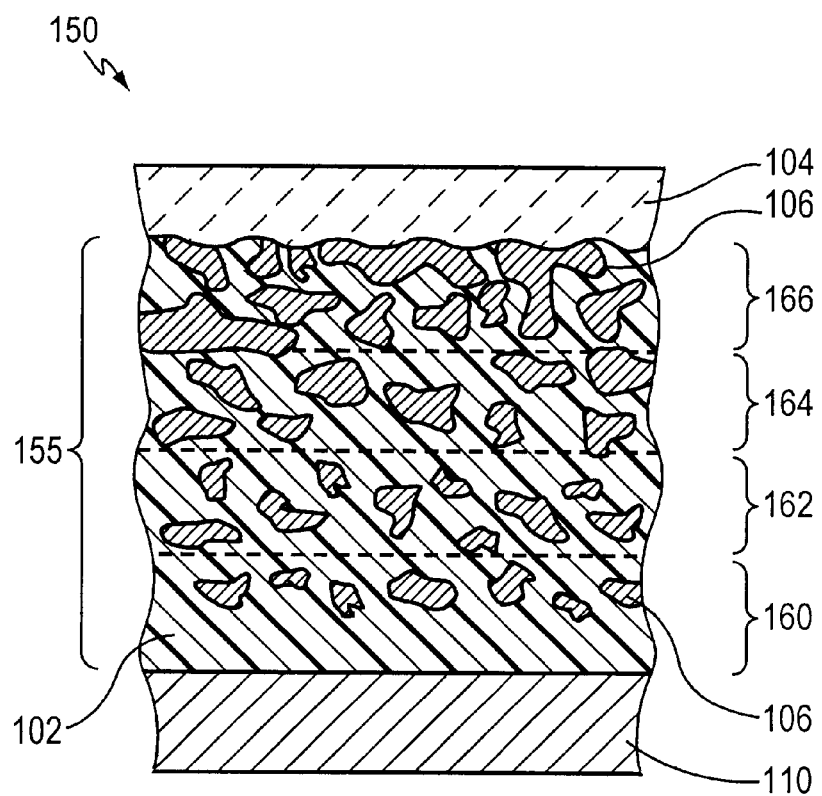
FIG. 2 is an enlarged sectional view of a multilayer construction having a graded organic/inorganic substrate and an inorganic layer thereover.

Representative constructions in accordance with the present invention are illustrated in FIGS. 1 and 2. In FIG. 1, a multilayer construction 100 comprises a polymeric layer 102 and an inorganic layer 104 (which may be, for example, a metal or a ceramic). A deposition material 106 is integrated within the matrix of polymer 102 and, covering all or much of the entire top surface thereof, provides a transition layer 106s between layers 102 and 104. While material 106 may in fact be no more chemically compatible with the polymer of layer 102 than would be the inorganic material of layer 104, its physical integration within the matrix of layer 102 affords strong mechanical adhesion. As shown, the surface layer 106s extends into the matrix of polymer 102 as a series of projections or "nails." The firmly anchored layer 106s is chemically compatible with inorganic layer 104 and therefore exhibits substantial adhesion to this layer.

Construction 100 may be manufactured as follows. A substrate 110, which may be metal, plastic (e.g., polyester), paper, or some other durable material, accepts a coating of a polymeric material to form layer 102. This polymeric material may, for example, be an acrylic polymer soluble in methyl ethyl ketone (MEK) and/or other solvents. The acrylic polymer is combined with selected multifunctional acrylate monomers and coated (cast) from solvent onto substrate 110. The multifunctional acrylate acts as a typical ester plasticizer, promoting adhesion and lowering the softening (melting) point of the polymer mixture. The ACRYLOID acrylic polymers B-44, B-72, and B-82, supplied by Rohm & Haas, represent suitable solvent-soluble acrylics; dipentaerythritolpentaacrylate (e.g., the SR-399 product supplied by Sartomer) represents a suitable multifunctional acrylate.

The substrate-borne acrylic mixture is heated to the softening point, whereupon deposition material 106 is applied to the exposed surface thereof. Material 106 may comprise one or more metals and/or metal alloys, intermetallics (i.e., two or more metals combined in a definite ratio), and/or compositions including one or more metals in combination with one or more nonmetals. Nonmetals for such compositions may include, for example, boron, carbon, nitrogen, oxygen, fluorine, and silicon. Material 106 may also be a hard inorganic compound such as silicon dioxide. Indeed, the deposition material can comprise a plurality of different substances.

Material 106 may be applied by conventional roll (web) coating, or by intermittent-motion machines such as those employed for glass coating. Alternatively, material 106 may be applied by a vacuum coating process such as vacuum evaporation, electron-beam (EB) evaporation, or sputtering. The implementational details of such processes are well-characterized in the art. The deposition process may involve controlled cooling to withdraw the latent heat resulting from condensation of the inorganic material from the vapor phase.

With the polymer 102 still in the softened state, it may be desirable to assist the migration of inorganic material 106 into polymer 102 in order to form the projections discussed above. One approach is to statically charge the inorganic material 106 and apply an opposite charge to substrate 110.

Layer 102 is then cured, causing it to intensively crosslink and thereby "freeze" the inorganic material 106 to impart permanence. An acrylate layer 102 can be cured by EB exposure. The cured polymer exhibits substantially greater temperature resistance than the original, uncured polymer (that is, following cure, layer 102 can no longer be readily softened) and its solubility in the solvent(s) from which it was originally coated is substantially decreased, if not eliminated.

Layer 104 is then applied to the surface 106s (which typically includes exposed portions of layer 102, since it is generally not necessary to ensure complete coverage of layer 102 by inorganic material 106). The nature of layer 104 depends, of course, on the application. An optically variable device, for example, may be in the form of a thin-film stack comprising a reflective metal layer, a dielectric layer thereover, and a partially reflective metal layer over the dielectric layer. Such a structure may be built up directly on surface 106s. For example, inorganic deposition material 104 may be a layer of aluminum that is oxidized to $Al_2O_3$ (e.g., by atmospheric exposure or by deposition in the presence of an oxygen-containing working gas); alternatively, inorganic deposition material 104 may be a layer of titanium that is oxidized into various oxides of titanium. This material is drawn into layer 102 as described above, and a reflective metal layer, such as aluminum, is deposited thereover (e.g., under vacuum conditions).

Alternatively, a thin-film capacitor may comprise alternating layers of aluminum and acrylic applied as discussed, for example, in the '446 and '774 patents mentioned below. An aluminum layer is applied onto a composite material as discussed above, which serves as a substrate providing superior interlayer anchorage.

A second embodiment is shown in FIG. 2. In this case, the construction 150 includes a graded layer 155 having a concentration of inorganic material 106 that increases with distance from substrate 110. Layer 155 is built up in successive stages as follows. A first coating 160 of polymeric material 102 is applied onto substrate 110, preferably either by vapor condensation or by coating. Particularly if layer 106 is deposited under vacuum, polymeric materials amenable to similar deposition conditions may be preferred for layer 102, allowing consecutive layers to be built up in multiple depositions within the same chamber or a linked series of chambers under common vacuum. One suitable approach is detailed in U.S. Pat. Nos. 5,440,446; 4,954,371; 4,696,719; 4,490,774; 4,647,818; 4,842,893; and 5,032,461, the entire disclosures of which is hereby incorporated by reference. In accordance therewith, an acrylate monomer is applied as a vapor under vacuum. For example, the monomer may be flash evaporated and injected into a vacuum chamber, where it condenses onto the surface. The monomer is subsequently crosslinked by exposure to actinic (generally UV) radiation or an EB source.

A related approach is described in U.S. Pat. No. 5,260,095, the entire disclosure of which is also incorporated by reference. In accordance with this patent, an acrylate monomer may be spread or coated onto a surface under vacuum, rather than condensed from a vapor. Again, the deposited monomer is crosslinked by UV or EB exposure.

Either of these approaches may be used to apply layer 102 onto substrate 110. Moreover, their applicability is not limited to monomers; oligomers or larger polymer fragments or precursors can be applied in accordance with either technique, and subsequently crosslinked. Useful acrylate materials include conventional monomers and oligomers (monoacrylates, diacrylates, methacrylates, etc.), as described at cols. 8–10 of the '446 patent, as well as acrylates chemically tailored for particular applications. Representative monoacrylates include isodecyl acrylate, lauryl acrylate, tridecyl acrylate, caprolactone acrylate, ethoxylated nonyl phenyl acrylate, isobornyl acrylate, tripropylene glycol methyl ether monoacrylate, and neopentyl glycol propoxylate methylether monoacrylate; useful diacrylates include 1,6-hexaneciol diacrylate, tripropylene glycol diacrylate, polyethylene glycol (200) diacrylate, tetraethylene glycol diacrylate, polyethylene glycol (400) diacrylate, polyethylene glycol (600) diacrylate, propoxylated neopentyl glycol diacrylate, the IRR-214 product supplied by UCB Radcure (aliphatic diacrylate monomer), propoxylated 1,6-hexanediol diacrylate, and ethoxylated 1,6-hexanediol diacrylate; and useful triacrylates include trimethylolpropane triacrylate (TMPTA) and ethoxylated TMPTA.

Finally, acrylate-functional or other suitable resin coatings can be applied onto substrate 110 in routine fashion (under atmospheric conditions), according to techniques well-known in the art. In one such approach, one or more acrylates are coated directly onto substrate 110 and later cured. In another approach, one or more acrylates is combined with a solvent (or solvents) and cast onto substrate 110, following which the solvent is evaporated and the deposited acrylate eventually cured. Volatile solvents, which promote highly uniform application at low coating weights, are preferred. Acrylate coatings can also include non-acrylate functional compounds soluble or dispersible into an acrylate.

After layer 160 of polymer 102 is applied but prior to curing, the inorganic filler 106 is applied onto polymer 102 in a desired ratio relative to polymer 102. In an uncured state, polymer 102 accepts inorganic material 106 in a manner analogous to a thermally softened layer as described above. Generally, it is not necessary to draw material 106 into layer 160, since layer 160 is generally quite thin. Particularly when applied by deposition techniques such as reactive sputtering, material 106 can form a pattern of patches or islands over the surface layer 160, which is then cured as set forth above.

Application of layer 160 by vapor condensation affords greater control over the pattern of deposition. Polymer 102 can be applied under conditions that do not permit coalescence and consequent film formation, thereby allowing creation of a discontinuous polymer layer. Inorganic material 106 is then deposited over the discontinuous pattern, so that the organic layer is effectively bound within the inorganic material rather than vice versa. As discussed above, application of material 106 from vapor generally requires provision for removal of the latent heat of condensation.

Following deposition and curing of layer 160, the process is repeated for subsequent layers 162, 164, 166, which are applied with different ratios of inorganic material 106 to polymer material 102. Preferably, the proportion of inorganic material increases in each stage, resulting in a graded structure with the amount of inorganic material increasing away from substrate 110 as illustrated. The composite layer 155 provides a gradual transition from an organic polymer to a mixed organic/inorganic material. The dispersed islands of inorganic material can be made to occur in "units" (grains, particles, crystals, etc.) that are one or more orders of magnitude smaller than solids traditionally dispersed in organic binders as pigments.

Alternatively, it is possible to apply layers 160–166 without individually curing each layer before applying the next one, i.e., delaying curing until the entire sequence of layers has been applied. This approach may provide efficiency and processing benefits.

Following completion of layer 155, layer 104 is applied as discussed above.

It will therefore be seen that the foregoing techniques provide a basis for improved multilayer constructions involving joined organic and inorganic layers. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of fabricating a composite structure, the method comprising:
   a. providing a first layer comprising a curable polymer and having a first surface;
   b. softening the first layer;
   c. depositing onto the first surface of the softened first layer a deposition material comprising an inorganic compound, the deposition material depositing onto the first surface and integrating within the first layer; and
   d. curing the first layer to immobilize the integrated deposition material.

2. The method of claim 1 further comprising the step of drawing the deposition material into the first layer.

3. The method of claim 2 wherein the drawing step comprises charging the deposition material and applying an opposite charge to a second surface opposed to the first surface to attract the deposition material through the first layer.

4. The method of claim 1 wherein the deposition material fully covers the first surface, forming a continuous layer thereover.

5. The method of claim 1 wherein the deposition material does not fully cover the surface, forming an intermittent pattern exposed on the surface.

6. The method of claim 1 wherein the first layer comprises an acrylic polymer combined with a multifunctional acrylate monomer, the curing step crosslinking the monomers and the polymer.

7. The method of claim 1 wherein the deposition step is carried out under vacuum.

8. The method of claim 1 further comprising the step of applying a second layer over the deposition material and any exposed portions of the first layer.

9. The method of claim 8 wherein the second layer is inorganic.

10. A method of fabricating a composite structure, the method comprising:
   a. depositing, onto a substrate, a mixture of a polymer precursor and a filler material comprising an inorganic compound, the polymer precursor and the filler being present in a ratio;
   b. repeating step (a) at least once with the polymer precursor and the filler being present in a different ratio; and
   c. curing the polymer precursor.

11. The method of claim 10 wherein step (a) is repeated a plurality of times with an increasing amount of filler relative to the polymer precursor, thereby producing a graded structure with the amount of filler increasing with distance from the substrate.

12. The method of claim 10 wherein the polymer precursor and the filler material are deposited as a vapor.

13. The method of claim 10 wherein the polymer precursor and the filler material are deposited as a liquid.

14. The method of claim 10 wherein the polymer precursor is cured by crosslinking to form a matrix.

15. The method of claim 14 wherein the polymer precursor comprises an acrylic polymer combined with a multi-functional acrylate monomer, the curing step crosslinking the monomers with the polymer.

16. The method of claim 10 further comprising the step of applying a layer over a surface of the structure.

17. The method of claim 16 wherein the layer is inorganic.

18. A composite structure fabricated in accordance with claim 1.

19. The structure of claim 18 wherein the deposition material fully covers the first surface, forming a continuous layer thereover.

20. The structure of claim 18 wherein the deposition material does not fully cover the surface, forming an intermittent pattern exposed on the surface.

21. The structure of claim 18 further comprising a second layer over the deposition material and any exposed portions of the first layer.

22. The structure of claim 21 wherein the second layer is inorganic.

23. A composite structure fabricated in accordance with claim 10.

24. The structure of claim 18 further comprising a layer over a surface of the structure.

25. The structure of claim 24 wherein the layer is inorganic.

26. The construction of claim 24 wherein the layer is transparent and the composite structure is opaque to actinic radiation.

27. The construction of claim 24 wherein the layer and the structure contrast in color to form a proofing sheet.

* * * * *